United States Patent
Metcalfe et al.

(10) Patent No.: US 6,266,438 B1
(45) Date of Patent: Jul. 24, 2001

(54) ARCHITECTURE FOR COLOR SPACE TRANSFORMATION TO COMPENSATE FOR RELATIVE CHIP-TO-CHIP SPECTRAL VARIATIONS ON A BUTTED FULL-WIDTH ARRAY SENSOR BAR

(75) Inventors: David J. Metcalfe, Marion; Dawn M. Williams-Fuller, Webster; Joseph P. Taillie, Pittsford; Josef E. Jedlicka, Rochester, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/162,097

(22) Filed: Sep. 28, 1998

(51) Int. Cl.[7] .................................................... G06K 9/00
(52) U.S. Cl. ............................................ 382/162; 358/518
(58) Field of Search ................................ 382/162–167; 438/68; 250/239–208.1, 559.1, 559.39; 156/160–297, 562; 358/1.9, 518, 520, 523

(56) References Cited

U.S. PATENT DOCUMENTS

| | | |
|---|---|---|
| 4,604,161 | 8/1986 | Araghi . |
| 4,679,073 * | 7/1987 | Hayashi ................................ 358/516 |
| 4,712,018 | 12/1987 | Stoffel et al. . |
| 4,735,671 | 4/1988 | Stoffel et al. . |
| 4,954,197 | 9/1990 | Jedlicka et al. . |
| 5,489,989 * | 2/1996 | Shimizu et al. ...................... 358/401 |
| 5,510,273 | 4/1996 | Quinn . |
| 5,621,217 | 4/1997 | Seachman et al. . |
| 5,753,959 | 5/1998 | Quinn et al. . |
| 5,870,531 * | 2/1999 | Sakai et al. ........................... 358/1.9 |
| 5,999,644 * | 12/1999 | Sugiura ................................ 382/162 |

* cited by examiner

Primary Examiner—Joseph Mancuso
Assistant Examiner—Ali Bayat
(74) Attorney, Agent, or Firm—Fay, Sharpe, Fagan, Minnich & McKee, LLP

(57) ABSTRACT

A color space transformation device includes a sensor bar. The sensor bar includes a plurality of sensor chips. Each sensor chip scans a unique section of an original image to produce first data in a first color space. A memory means stores groups of coefficients. Each group of coefficients corresponds to one of the sensor chips. A processor independently transforms each of the sections of the first data to a respective section of a second data. The transformation is performed as a function of one of the groups of coefficients corresponding to the sensor chip which produced the first data.

20 Claims, 3 Drawing Sheets

ARCHITECTURE FOR COLOR SPACE TRANSFORMATION TO COMPENSATE FOR RELATIVE CHIP-TO-CHIP SPECTRAL VARIATIONS ON A BUTTED FULL-WIDTH ARRAY SENSOR BAR

BACKGROUND OF THE INVENTION

The present invention relates to semiconductor chips mounted on a substrate. It finds particular application in conjunction with compensating for different spectral characteristics between the chips and will be described with particular reference thereto.

Image sensor arrays for scanning original documents, such as Charge Coupled Devices (CCD's), typically have a row or linear array of photosites together with suitable supporting circuitry integrated onto a silicon substrate. Usually, an array of this type is used to scan, line by line, across the width of a document with the document being moved or stepped lengthwise in synchronism therewith.

A linear array of small photosensors are commonly provided in a full-page-width image scanner. The photosensors extend the full width of an original document (e.g., eleven (11) inches). These photosensors are spaced as finely as 600 to the inch on each chip. In a document scanner, optical means, e.g., a lens, is used to form an original image of the light reflected from the original document. When the original document moves past the linear array, each of the photosensors converts light from the original image into electrical signals. The motion of the original document perpendicular to the linear array causes a sequence of signals to be output from each photosensor. These output signals are converted into digital data.

The full-width array bar is typically assembled from a number of semiconductor sensor chips butted against one another to form a colinear array. The sensor chips are fabricated in groups, with many chips being formed on a single silicon wafer. The wafers, in turn, are processed in batches. It is not uncommon for the sensor chips in a full-width array to be selected from different wafers and different batches. Although the variations from batch-to-batch and wafer-to-wafer are ideally controlled, chip-to-chip differences do exist because of inherent tolerances in microelectronics fabrication. Therefore, when the chips are butted next to each other on the bar, the chips can produce color differences and/or banding in the scanned output image.

The currently-preferred design for creating a long linear array of photosensors includes using a set of relatively small semiconductor chips. Each semiconductor chip defines thereon a linear array of photosensors along with ancillary circuit devices. These chips are typically approximately 0.62 inches in length. Therefore, in order to create a practical full-page width array, as many as twenty (20) or more of these chips are abutted end-to-end to form a single linear array of photosensors.

The abutted chips are typically mounted on a support platform. This support platform also includes circuitry, such as on a printed wire board, which accesses the circuit devices on the individual chips for a practical system. The interconnections between the relatively large-scale conductors on the printed wire board and the relatively small contact pads on the semiconductor chips are preferably created by wire bonds. Typically, these wire bonds are ultrasonically welded to both the printed wire board conductors and to contact pads on the chips.

One advantage of a system using a single, color sensor chip for capturing a full scanline of data is that red, green and blue ("RGB") filters, typically placed on the photosite areas within the wafer, are well controlled. However, as referenced above, one drawback to such an arrangement is that the semiconductor chips forming a full-width array typically do not all have similar filter characteristics. Such a phenomenon is caused by several factors. For example, semiconductor chips are commonly produced in batches. It is not unusual for chips produced in one batch to have unique colorant and spectral characteristic profiles. These different profiles may be caused by different filter thicknesses occurring from one batch to the next because of various photolithographic techniques which are used to produce the chips. Differences in the thickness and spectral characteristic profiles both play an important role in the final colormetric output from one semiconductor chip to another. More specifically, different spectral characteristics between various chips on the sensor bar may cause color banding to occur in the final picture.

One currently used method for determining spectral characteristics between various chips on the sensor bar is to measure the filter thicknesses of the wafers on each chip. The chips are then pre-sorted according to the thicknesses of the wafers. Although this method results in a linear array including chips having wafers of similar thicknesses, the process of measuring and sorting the filters is very expensive and time consuming.

The present invention provides a new and improved apparatus and method which overcomes the above-referenced problems and others.

SUMMARY OF THE INVENTION

A system transforms first data representing an original document in a first color space to second data representing the image in a second color space. A plurality of sensors scan the original document and produce the first data. Each sensor produces a portion of the first data. At least two of the sensors include different spectral characteristics. A memory stores a plurality of sets of coefficients. Each set of coefficients corresponds to one of the sensors. A converter transforms the first data to the second data as a function of the sets of the coefficients. Each of the portions of the first data is transformed as a function of the set of coefficients corresponding to the respective sensor.

In accordance with one aspect of the invention, the plurality of sensors are butted against one another to form a full-width array sensor bar.

In accordance with a more limited aspect of the invention, the plurality of sensors are color sensors.

In accordance with an even more limited aspect of the invention, the original document is an original color document.

In accordance with another aspect of the invention, the system also includes a multiplexer for dynamically switching the set of the coefficients corresponding to the respective sensor into the converter.

In accordance with a more limited aspect of the invention, the converter transforms one portion of the first data during each of a plurality of steps. The system also includes a means for identifying the sensor corresponding to the portion of the first data which is being transformed during the respective step.

In accordance with an even more limited aspect of the invention, the sensor chip storage memory is a random access storage memory.

In accordance with another aspect of the invention, the system also includes a means for storing the second data.

In accordance with a more limited aspect of the invention, the system also includes a second converter for transforming the second data into a color space compatible with a color printing device. A color printer produces a printed output from the transformed second data.

One advantage of the present invention is that it compensates for relative chip-to-chip color filter variations on a butted full-width array sensor bar.

Another advantage of the present invention is that it is not necessary to sort the chips according to their filter thicknesses.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
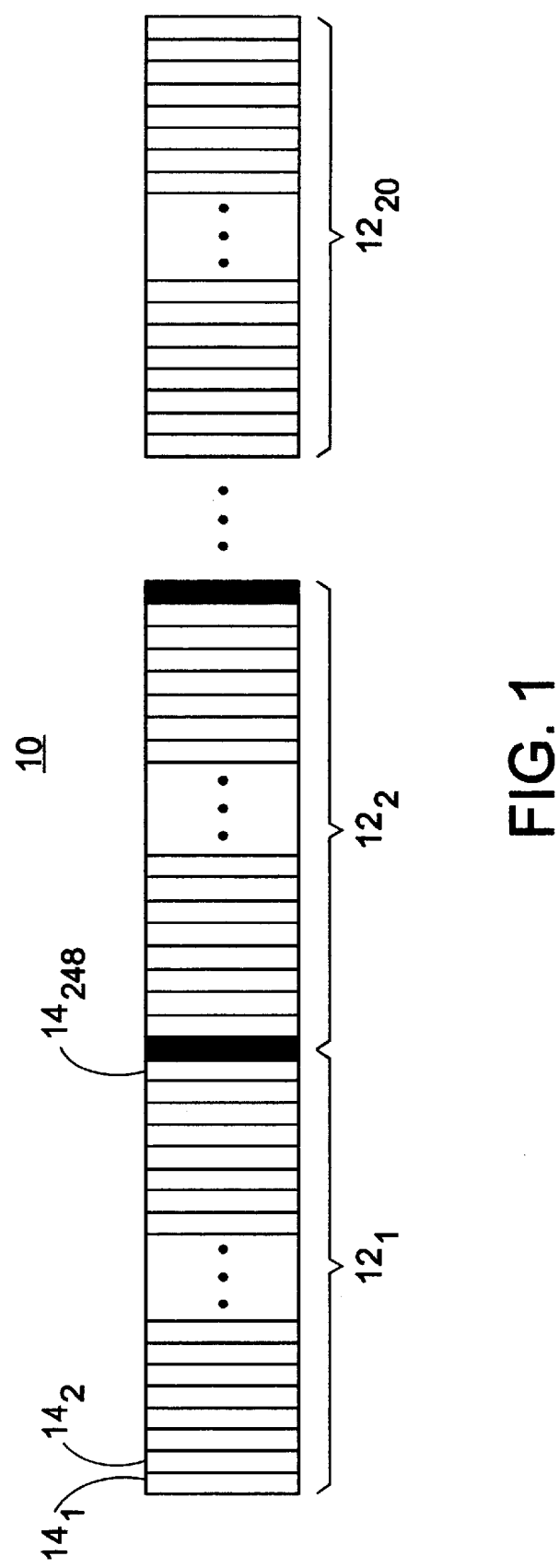
FIG. 1 illustrates a full-width array color sensor bar.

FIG. 1 illustrates a full-width array ("FWA") color sensor bar 10. The sensor bar 10 includes a plurality of individual color sensor chips 12, which in turn include a plurality of photosensors 14. The sensor chips 12 are butted against one another in a colinear array. In the preferred embodiment, the sensor bar 10 includes twenty (20) sensor chips $12_1$, $12_2$, . . . $12_{20}$ and each sensor chip 12 includes 248 photosensors $14_1$, $14_2$, . . . $14_{248}$. Furthermore, the photosensors 14 are preferably spaced approximately 0.62 inches from each other. However, it is to be understood that other embodiments are also contemplated.

Preferably, each photosensor 14 includes red, green, and blue filters. These filters enable the sensor chips 12 to detect colors, in RGB color space, which are associated with respective pixels of an original color image.

The FWA sensor bar 10 is designed to process an entire line of an original color document in one scan. During the scan, data representing the red, green, and blue colors in the original color image are stored in the photosensors 14. Once the data for an entire line of the original color image is gathered, it is desirable to dynamically transform the RGB data into a standardized device independent color space (e.g., the L*a*b* color space). The L*a*b* color space includes coordinates representing a lightness value, a redness-greenness value, and a yellowness-blueness value. In order to achieve this transformation, the RGB color space data is typically first transformed into an intermediate color space (e.g., the XYZ color space). The intermediate color space data is then transformed into the L*a*b* color space.

Figure 2:
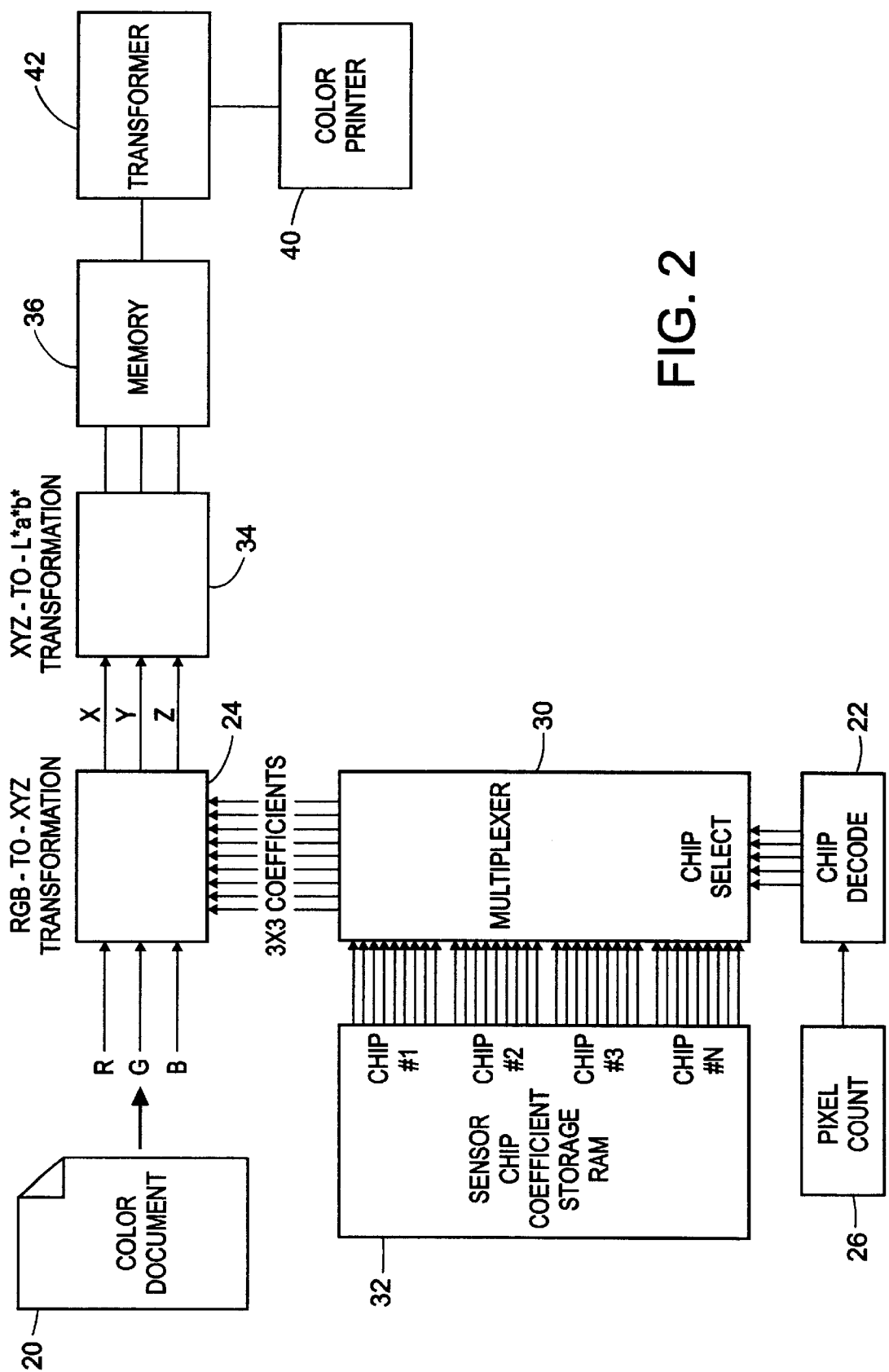
FIG. 2 illustrates a functional block diagram representing the transformation of the RGB color space data to L*a*b* color space.
Figure 3:
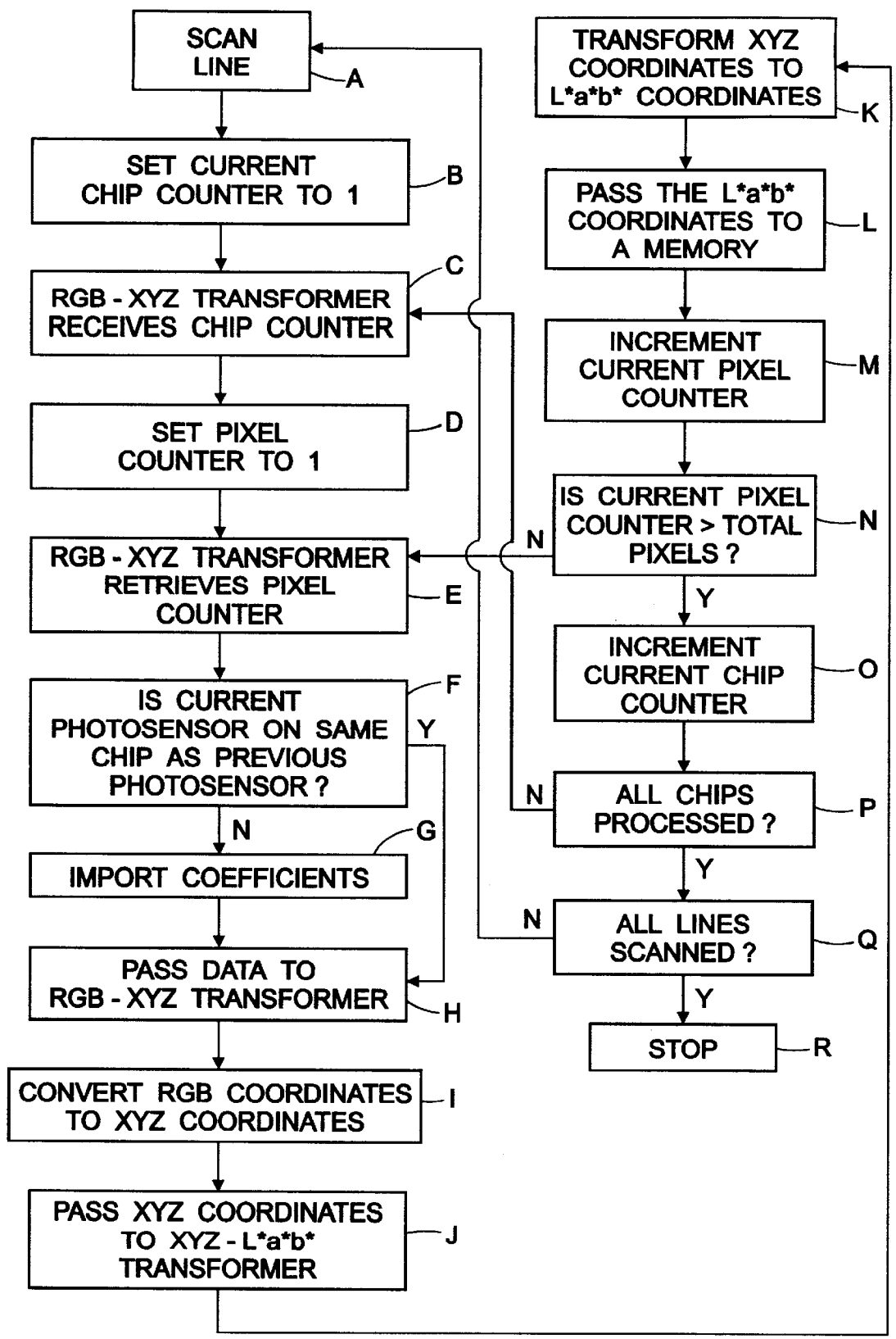
FIG. 3 illustrates the steps disclosed in the preferred embodiment of the present invention.

With reference to FIGS. 2 and 3, a line of an original color document 20 is scanned by a FWA color sensor bar in a step A. In this step, data for each pixel in the line of the original color document 20 is stored in corresponding photosensors in the sensor chips. More specifically, there is a one-to-one correspondence between each photosensor and a respective pixel in the original color document 20. Therefore, each photosensor scans color image data for one pixel in the original color image 20.

A current chip counter value, which is stored in a chip decode 22, is set to one (1) in a step B. In a step C, a RGB-XYZ transformer 24 retrieves the current chip counter value (e.g., between 1 and 20) from the chip decode 22. A current value of a pixel counter 26 is set to one (1) in a step D. In a step E, the RGB-XYZ transformer 24 retrieves the current pixel counter value (e.g., between 1 and 248) from the chip decode 22 through a multiplexer 30. The current pixel counter value and current chip decode value identify a current photosensor within one of the chips.

In the step F, a determination is made whether the current photosensor is on the same chip as the previous photosensor (i.e., whether the current chip counter value equals one (1)). If the current photosensor is not on the same chip as the previous photosensor, the RGB-XYZ transformer 24 imports nine (9) coefficients, in a step G, which are associated with the chip on which the current photosensor is located. The coefficients are stored in a sensor coefficient storage memory 32 and passed to the RGB-XYZ transformer 24 via the multiplexer 30.

The RGB color space data corresponding to the current photosensor within the identified chip is then passed to the RGB-XYZ transformer 24 in a step H. The RGB-XYZ transformer 24 converts the RGB color space data into XYZ coordinates in a step I as a function of the nine (9) coefficients associated with the chip on which the current photosensor is located. The transformation between the RGB color space and the XYZ color space is linear. More specifically, the nine (9) coefficients represent the nine (9) elements of a 3×3 matrix used to transform the RGB data coordinates into coordinates of the XYZ color space.

The XYZ coordinates are representative of a standardized intermediate color space. The XYZ values are passed to an XYZ-L*a*b* transformer 34 in a step J. The XYZ values are transformed into L*a*b* values in a step K. The conversion between the XYZ and L*a*b* coordinates is nonlinear and is commonly performed using a look-up table for each of the XYZ components along with a 3×3 matrix. The L*a*b* color space coordinates are then passed to a memory 36 in a step L. The L*a*b* color space coordinates are stored in the memory 36 until it is desirable to reproduce the original color image.

The L*a*b* color space coordinates can be used, for example, to reproduce the original color image on a color printer 40 or color facsimile machine. To accomplish such a reproduction, the L*a*b* color space coordinates are transformed by another transformer 42 to, for example, CMYK coordinates.

Once the data values associated with the current pixel counter are transformed into L*a*b* color space coordinates, the current pixel counter is incremented by one (1) in a step M. The value of the current pixel counter is compared with the total number of pixels (e.g., 248) on the current chip in a step N.

If the value of the current pixel counter is not greater than the total number of pixels on the current chip, control is passed to step E.

If the value of the current pixel counter is greater than the total number of pixels on the current chip, the value of the current chip counter is incremented by one (1) in a step O. In this case, a determination is made, in step P, whether all the chips have been processed. If all the chips have been processed, a determination is made, in step Q, whether all the lines of the original color image have been scanned. If all the lines have been scanned, the algorithm stops in step R. Otherwise, control is returned to step A. If all the chips have not been processed, control is returned to step C to scan the next line of the document.

While the preferred embodiment deals specifically with a one dimensional scan bar and an optical means for forming an image of the original document, other embodiments are also contemplated. For example, similar principles also apply to 2 dimensional electronic image sensors and to contact (i.e., lensless) systems.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A system for transforming first data representing an original image in a first color space to second data representing the image in a second color space, comprising:
   a plurality of sensors for scanning pixels in the original image and producing the first data, each sensor scanning a plurality of colors associated with the pixels in a respective one of a plurality of portions included in the original image and producing a corresponding portion of the first data, at least two of the sensors including different spectral characteristics;
   a memory for storing a plurality of sets of coefficients, each of the sets of coefficients corresponding to one of the sensors; and
   a converter for transforming the first data to the second data as a function of the respective set of coefficients corresponding to the sensor for the respective portion of the original image.

2. The system for transforming as set forth in claim 1, wherein the plurality of sensors are butted against one another to form a full-width array sensor bar.

3. The system for transforming as set forth in claim 2, wherein the plurality of sensors are color sensors.

4. The system for transforming as set forth in claim 3, wherein the original image is an original color image.

5. The system for transforming as set forth in claim 2, further including:
   a multiplexer for dynamically switching the set of the coefficients corresponding to the respective sensor into the converter.

6. The system for transforming as set forth in claim 5, wherein the converter transforms one portion of the first data during each of a plurality of steps, further including:
   means for identifying the sensor corresponding to the portion of the first data being transformed during the respective step.

7. The system for transforming as set forth in claim 6, wherein the sensor chip storage memory is a random access storage memory.

8. The system for transforming as set forth in claim 1, further including:
   means for storing the second data.

9. The system for transforming as set forth in claim 8, further including:
   a second converter for transforming the second data into a color space compatible with a color printing device; and
   a color printer for producing the transformed second data.

10. A method of transforming source data representing an image in a first color space to target data representing the image in a second color space, comprising:
    storing a plurality of groups of predetermined coefficients in an accessible memory, each of the groups of the predetermined coefficients corresponding to one of a plurality of chips in a sensor array;
    scanning pixels within the image with the chips to acquire a plurality of source data segments, each of the chips scanning a plurality of colors and being associated with a respective one of a plurality of portions of the image, each of the source data segments being stored in one of the chips in the sensor array;
    reading one segment of the source data from one of the chips in the sensor array into a transformer;
    determining the one chip in the sensor array with which the one segment of the source data is associated;
    transferring one of the groups of the predetermined coefficients, which corresponds to the one chip, to the transformer; and
    transforming the segment of the source data from the first color space to a segment of the target data as a function of the one group of predetermined coefficients and the chip, the segment of the target data representing the segment of the source data in the second color space.

11. The method of transforming data according to claim 10, further including:
    storing the segment of the target data in a second memory.

12. The method of transforming data according to claim 10, the step of scanning including:
    scanning an entire line of the image to acquire the plurality of source data segments.

13. The method of transforming data according to claim 10, further including:
    repeating the steps of reading, determining, transferring, and transforming for each of the other source data segments in the scanned line.

14. The method of transforming data according to claim 10, wherein the step of transforming includes:
    transforming the source data from an RGB color space to a L*a*b* color space.

15. The method of transforming data according to claim 14, wherein the step of transforming includes:
    transforming the source data from an RGB color space to a L*a*b* color space via an XYZ color space.

16. The method of transforming data according to claim 10, wherein the step of transferring includes:
    passing one of the groups of the predetermined coefficients, which corresponds to the one chip, to the transformer via a multiplexer.

17. The method of transforming data according to claim 10, wherein each of the source data segments corresponds to one pixel in the image, the step of determining including:
    counting pixels in the image which have been transformed; and
    counting chips for which all the corresponding pixels in the image have been transformed.

18. A color space transformation device, comprising:
    a sensor bar including a plurality of sensor chips, each sensor chip being capable of scanning a plurality of colors associated with a respective one of a plurality of unique sections of an original image to produce respective first data in a first color space;
    a memory means for storing groups of coefficients, each group of coefficients corresponding to one of the sensor chips; and
    a processor for independently transforming one of the sections of the first data to a respective section of a second data, the transformation being performed as a function of one of the groups of coefficients corresponding to the section and the sensor chip which produced the first data.

19. The color space transformation device according to claim 18, further including:
a multiplexer connected to the memory means and the processor for transferring the one group of coefficients, corresponding to the sensor chip which produced the first data, from the memory means to the processor.

20. The color space transformation device according to claim 18, wherein each section of the original image includes a plurality of pixels, the color space transformation device transforming individual and sequential pixels of each section of the original image during a plurality of respective steps, further including:
a pixel counter for counting a number of transformed pixels within each sensor chip; and
a chip counter for counting a number of sensor chips which have had all pixels transformed, the one group of coefficients being identified as a function of values produced by the pixel counter and the chip counter.

* * * * *